United States Patent [19]
Bour

[11] Patent Number: 5,812,576
[45] Date of Patent: Sep. 22, 1998

[54] LOSS-GUIDED SEMICONDUCTOR LASERS

[75] Inventor: David P. Bour, Cupertino, Calif.

[73] Assignee: Xerox Corporation, Stamford, Conn.

[21] Appl. No.: 703,293

[22] Filed: Aug. 26, 1996

[51] Int. Cl.$^6$ ........................................................ H01S 3/19
[52] U.S. Cl. ................................ 372/45; 372/46; 372/48; 372/50
[58] Field of Search .................................. 372/45, 46, 50, 372/48

[56] References Cited

U.S. PATENT DOCUMENTS 5,289,487   2/1994   Shimada ..................................... 372/46

OTHER PUBLICATIONS

D.P. Bour, G.A. Evans, "Lateral mode discrimination in AlGaInP selectivity buried ridge waveguide lasers," IEEE Proceedings–J, vol. 139, No. 1, Feb. 1992, pp. 71–74.

S. Adachi, "Band gaps and refractive indices of AlGaAsSb, GaInAsSb, and InPAsSb: Key properties for a variety of the 2–4 $\mu$m optoelectronic device applications," J. Appl. Phys. 61 (10), 15 May 1987, pp. 4869–4876.

K. Aiki, M. Nakamura, T. Kuroda, J. Umeda, R. Ito, N. Chinone and M. Maeda, "Transverse Mode Stabilized Al$_x$Ga$_{1-x}$As Injection Lasers with Channeled–Substrate–Planar Structure," IEEE Journal of Quantum Electronics, vol., QE–14, No. 2, Feb. 1978, pp. 89–94.

M.A. Haase, P.F. Baude, M.S. Hagedorn, J. Qiu, J.M. DePuydt, H. Cheung, S. Guha, G.E. Höfler, and B.J. Wu, "Low–threshold buried–ridge li–Vi laser diodes," Appl. Phys. Lett. 63(17), 25 Oct. 1993, pp. 2315–2317.

S. Nakamura, M. Senoh, S. Nagahama, N. Iwasa, T. Yamada, T. Matsushita, H. Kiyoku and Y. Sugimoto, "InGaN–Based Multi–Quantum–Well–Structure Laser Diodes," Jpn, J. Appl. Phys. vol. 35 (1996) pp. L74–L76, Part 2, No. 1B, 15 Jan. 1996.

S. Nakamura, M. Senoh, S. Nagahama, N. Iwasa, T. Yamada, T. Matsushita, H. Kiyoku and Y. Sugimoto, "InGaN multi–quantum–well structure laser diodes grown on MgAl$_2$O$_4$substrates," Appl. Phys. Lett. 68 (15), 8 Apr. 1996, pp. 2105–2107.

S. Nakamura, M. Senoh, S. Nagahama, N. Iwasa, T. Yamada, T. Matsushita, H. Kiyoku, and Y. Sugimoto, "Characteristics of InGaN multi–quantum–well–structure laser diodes," Appl. Phys. Lett. 68 (23), 3 Jun. 1996, pp. 3269–3271.

S. Nakamura, M. Senoh, S. Nagahama, N. Iwasa, T. Yamada, T. Matsushita, H. Kiyoku and Y. Sugimoto, "InGaN Multi–Quantum–Well–Structure Laser Diodes with Cleaved Mirror Cavity Facets," Jpn. J. Appl. Phys. vol. 35 (1996) Pt. 2 No. 2B, 15 Feb. 1996, pp. L217–L220.

G.E. Jellison, Jr. and F.A. Modine, "Parameterization of the optical functions of amorphous materials in the interband region," Appl. Phys. Lett. 69 (3), 15 Jul. 1996, pp. 371–373.

M. Ukita, H. Okuyama, M. Ozawa, A. Ishibashi, K. Akimoto, and Y. Mori, "Refractive indices of ZnMgSSe alloys lattice matched to GaAs," Appl. Phys. Lett. 63 (15), 11 Oct. 1993, pp. 2082–2083.

I. Akasaki, H. Amano, S. Sota, H. Sakai, T. Tanaka and M. Koike, "Stimulated Emission by Current Injection from an AlGaN/GaN/GaInN Quantum Well Device," Jpn. J. Appl. Phys. vol. 34 (1995) pp. L1517–L1519, Part 2, No. 11B, 15 Nov. 1995.

G.A. Evans, J.K. Butler and V.J. Masin, "Lateral Optical Confinement of Channeled–Substrate–Planar Lasers with GaAs/AlGaAs Substrates," IEEE Journal of Quantum Electronics, vol. 24, No. 5, May 1988, pp. 737–749.

*Primary Examiner*—James W. Davie

[57] ABSTRACT

The present invention relates to a short-wavelength loss-guided structure using Group III-V nitride material. Specifically, waveguiding in the lateral direction is achieved by placing a high index material in close proximity to the active layer of the laser, which gives rise to outcoupling of light from the lateral waveguides. The present invention provides higher laser beam quality and simplifies the processing technology.

11 Claims, 6 Drawing Sheets

LOSS-GUIDED SEMICONDUCTOR LASERS

FIELD OF INVENTION

The present invention relates generally to solid state laser devices. More specifically, the invention relates to a loss-guided laser structure which emits short-wavelength radiation.

BACKGROUND OF INVENTION

Solid state lasers made from Group III-V nitrides such as InAlGaN, have great potential in applications in many areas such as high-resolution full-color printing, high-density optical storage, advanced display systems, and optical communications. Since materials in the Group III-V nitride system have bandgaps that vary from 1.9 eV to 6.2 eV, a laser or light emitting diode ("LED") made from a Group III-V nitride may emit light at a wavelength ranging from 380 to 600 nanometers (nm). A laser made from GaN can emit light in the ultra-violet region of the spectrum whereas a laser made from InN can emit light in the red region. Therefore, the Group III-V nitride material system can produce lasers at wavelengths covering a wide range of the electromagnetic spectrum.

The lasers formed by materials in the Group III-V nitride system which produce emissions at short wavelength such as green or blue have particularly significant implications in high-resolution printing and high-density optical storage. For instance, substantial effort has been expended in developing a blue laser for high-resolution printing because of a blue laser's small fundamental spot size and superior depth of focus. The small spot size allows for higher "dpi" (dots per inch) printing, and therefore improved resolution. The superior depth of focus enables a blue laser to be easily focused, allowing for the use of relatively low cost optics even in high resolution printing system.

Short-wavelength lasers also allow for high density optical storage of audio information, video information, and data. Conventional compact disc ("CD") players and CD-ROM drives use a red laser beam. Currently, a standard 12.7 cm CD can hold up to 650 megabytes of data. Blue lasers, at half the wavelength of red lasers, have much smaller spot sizes and can read and write in finer detail on optical discs, thereby substantially increasing their data capacity. They will allow audio CD's and CD-ROMS to store up to at least ten times the information they currently hold. Blue laser systems will also produce better signal-to-noise ratios than can be achieved from traditional red laser systems, which could result in significantly better sound or video quality.

As stated previously, in addition to producing short-wavelength lasers, the Group III-V nitride material system can produce lasers which emit light at a wavelength ranging from 380 to 600 nanometers (nm). The ability to produce lasers with large wavelength separation with a single material system is important in full-color xerographic printing. Generally, in xerographic printing, a full-color print is formed by superimposing an electrostatic image in black with an electrostatic image in each of the three primary colors (cyan, magenta, and yellow). In order to achieve high-speed single-pass printing, four laser beams are typically required, one for each color and black. The laser beams simultaneously strike a single raster output polygon mirror and a single set of scan optics. The beams are then separated by optical filters, and each beam is directed to a photoreceptor for printing a color.

In order for the optical filters to effectively isolate each beam at a reasonable cost, the laser beams must typically have a separation of at least 150 nanometers in their wavelengths. To make such a four-laser array on the same substrate, the use of two semiconductor material systems is generally required. For instance, the $Al_xGa_{1-x}As$ material system can produce lasers with wavelengths from approximately 750 nanometers to 850 nanometers whereas the AlGaInP material system can produce lasers from approximately 630 to 700 nanometers. In contrast, a laser array formed using materials in the Group III-V nitride system can achieve large wavelength separations without using a second material system.

Blue lasers can also be used to produce brighter and more efficient projection displays. It can also be used for backlighting in direct view displays such as screens for laptop computers. Furthermore, due to the physical and electronic properties of materials in the Group III-V nitride system, devices formed using such materials can withstand higher temperatures, higher power densities, and harsher environmental conditions. Hence, the need for lasers formed using Group III-V nitrides crosses a wide spectrum of applications.

Unfortunately the development of lasers formed by Group III-V nitride materials has been hampered by numerous problems in the processing technology of such materials. For instance, the difficulties in forming high-quality single-crystalline Group III-V nitride materials are well known. Group III-V materials tend to form dislocations and cracks easily. They are also difficult to remove by etching. As a result, lasers formed using Group III-V nitrides typically employ a gain-guided structure. The active region of such a structure in which gain is achieved is defined by the current injection path. Typically, current is injected into a very narrow stripe region which forms the lasing element. In a gain-guided laser, there is no built-in refractive index step in the lateral direction, which results in inferior beam quality when compared with index-guided lasers. Gain-guided lasers generally have higher astigmatism—a problem which occurs when a different depth of focus exists in the vertical versus the horizontal direction. The degree of astigmatism often varies with the current drive condition, making beam focusing particularly difficult. As a result, there is a need to develop an index-guided laser structure using Group III-V nitride materials.

Generally, a typical index-guided laser structure uses a low-index material to form the lateral waveguides. Another approach is to achieve waveguiding in the lateral direction by placing a high-index material in proximity to the active layer of the laser which gives rise to outcoupling of light from the lateral waveguides. The outcoupling contributes to a reduction in the effective refractive index and represents a loss which stabilizes the spatial mode of the laser in the lateral direction. Such an index-guided laser is also described as a loss-guided laser.

The formation of the lateral waveguides in loss guided laser structures is often complicated by the relationship between the refractive indices of materials and their band gaps. The refractive indices of materials are generally related to their band structures through the well-known Kramers-Kronig principle. A discussion of Kramers-Kronig principle can be found in "Quantum Electronics" by A. Yariv, John Wiley & Sons Co. (1975). Under this principle, the refractive indices of materials in a system generally decrease with increasing band gaps. For instance, the relationship between refractive indices and band gaps in the AlGaAs and AlGaInP material systems appear to conform to the Kramers-Kronig principle. However, there are exceptions to this principle. For instance, the Kramers-Kronig principle seems to be violated in the antimonide (GaInAsSb) material system in which the refractive index decreases as the alloy's composition is adjusted so that the bandgap decreases. Hence, substantial effort has been expended in the attempt to fabricate loss-guided lasers in Group III-V nitride material system.

BRIDE SUMMARY OF INVENTION

The present invention provides a loss-guided single-mode $Al_xGa_yIn_{1-x-y}N$ solid state laser structure which can be used for xerographic printing and optical storage. The loss-guided laser structure in accordance with the present invention uses a low band gap nitride material such as GaN or InGaN or a high-index non-crystalline material to form the lateral waveguides. The use of GaN or InGaN is possible because the refractive indices of materials in the nitride system generally increase with decreasing band gaps. The use of the non-crystalline material to form the lateral waveguides will allow the use of mixed materials such as a Group III-V nitride in combination with a high-index non-crystalline material, to form a single structure.

One advantage of the present invention is that it uses loss-guiding principles to achieve lateral waveguiding. Unlike a gain-guided laser, the present invention provides superior beam quality and simplifies beam focusing issues.

Another advantage of the present invention is the simplification of processing which allows for the fabrication of short-wavelength lasers in the blue and green portion of the spectrum, which have wide applications in high-resolution printing and high-density optical storage systems. Such short-wavelength lasers have smaller spot size and superior depth of focus.

A further advantage is that it greatly simplifies the processing required to form a laser using Group III-V nitrides. Under this approach, the active region will be formed using layers of Group III-V nitrides. The lateral waveguides can be formed using a nitride material such as GaN and InGaN. They can also be formed using non-crystalline materials that can be spun-on or deposited at low temperatures such as below 700° C. Since materials in the Group III-V nitride system have relatively low refractive indices of approximately 2.5, the lateral waveguides can be formed using non-crystalline materials such as amorphous silicon, polycrystalline silicon, or polycrystalline diamond, all of which generally have higher refractive indices than Group III-V nitrides and can be deposited at low temperatures. Their refractive indices typically range from 2.5 to 4.7, which are sufficiently high to form loss-guided structures in Group III-V nitrides. Since these non-crystalline materials are easier to process than Group III-V nitrides, the fabrication of lasers under this approach will be easier.

The advantages and objects of the present invention will become apparent to those skilled in the art from the following detailed description of the invention, its preferred embodiments, the accompanying drawings, and the appended claims.

DETAILED DESCRIPTION OF PREFERRED EMBODIMENTS

Figure 1:
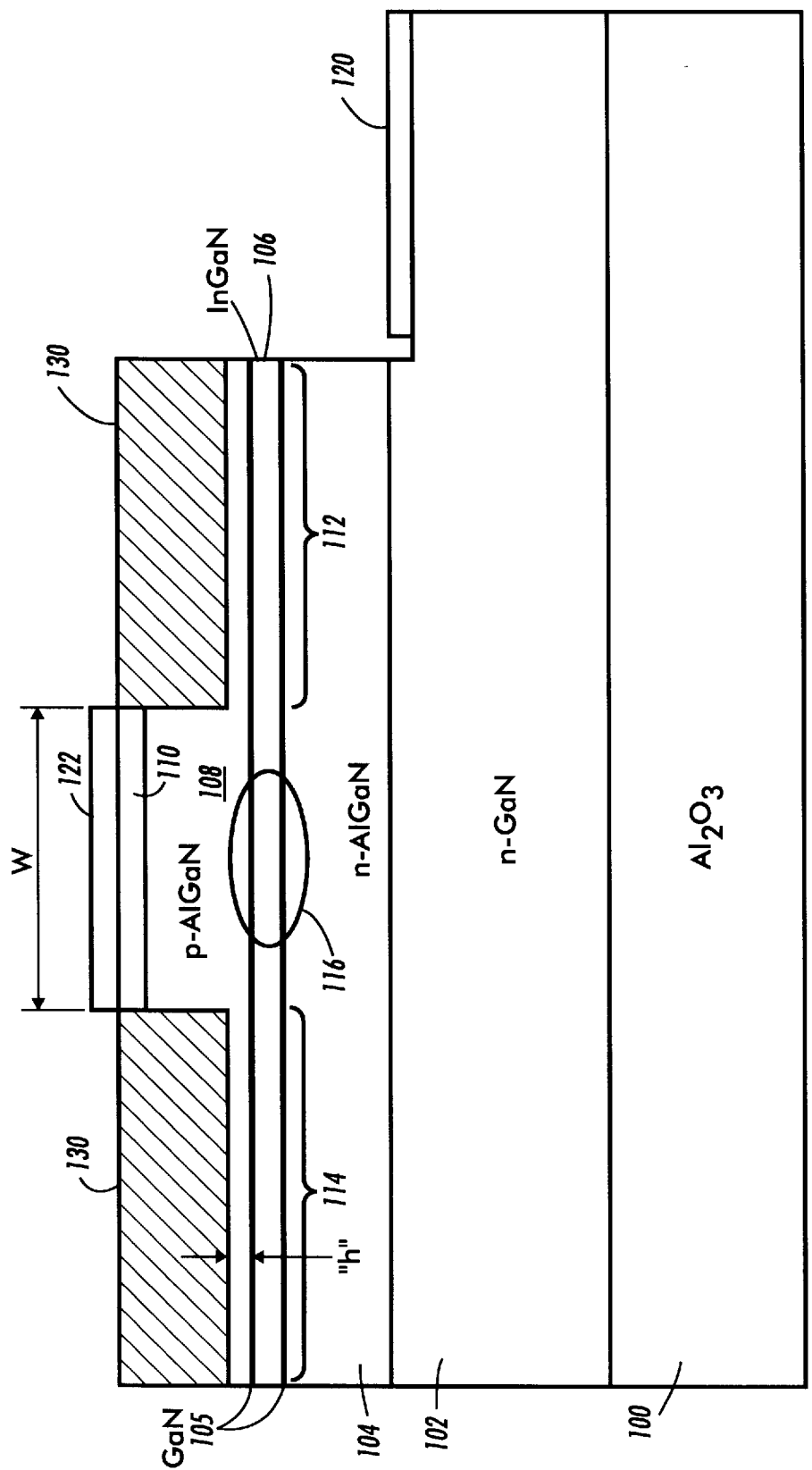
FIG. 1 illustrates a cross-sectional view of a laser structure which uses a high-index material deposited over a groove structure waveguide to achieve lateral waveguiding.

FIG. 1 illustrates the preferred embodiment of the present invention. It illustrates a laser structure formed by a combination of Group III-V nitrides and a high-index non-crystalline material. The shaded regions 130 in FIG. 1 represent a high index material such as polysilicon. However, nothing in the present invention prevents the use of regrown crystalline GaN or InGaN as the high-index material 130. If InGaN is used, the indium mole fraction typically ranges from 0 to 40 percent. "h" in FIG. 1 represents the distance between the high index material 130 and the top GaN layer 105. The GaN layers 105 and the InGaN active layer 106 are often referred to as the active region. "h" is typically 1000 to 3000 Angstroms. The laser structure is formed on a "C"-plane sapphire ($Al_2O_3$) substrate. Other substrates known to those of ordinary skill in the art, such as "A"-plane sapphire, silicon carbide or spinel substrate ("$MgAl_2O_4$") may also be used. The nitride layers are grown by an epitaxial deposition process known as metal-organic chemical vapor deposition (MOCVD) at approximately 700° to 1100° C. Liquid phase epitaxy ("LPE"), molecular beam epitaxy ("MBE"), and other known crystal growth processes may also be used.

As shown in FIG. 1, a GaN buffer layer 102 of one to five microns ($\mu$m) is first deposited on the $Al_2O_3$ substrate 100. The bandgap of the GaN buffer layer 102 is approximately 3.4 eV, and its doping is typically n-type in the mid-$10^{18}$cm$^{-3}$ range. Silicon (Si), selenium (Se), tellurium (Te), sulphur (S), and other n-type dopants can all be used. Since the n-type contact 120 is formed directly over the GaN buffer layer 102, the doping level in the GaN buffer 102 should be relatively high to facilitate the formation of ohmic contacts and lateral electron transport. However, a doping level substantially above $10^{19}$ cm$^{-3}$ is not used in this embodiment because of "alloy hardening" effects, which lead to cracking. It is well known that highly-doped GaN is susceptible to alloy hardening which typically causes cracks in the epitaxial film. Dislocations and cracks in the GaN buffer layer 102 is a particularly serious problem in light of the relatively large lattice mismatch between the $Al_2O_3$ substrate 100 and the GaN layer 102.

After the GaN buffer layer 102 has been epitaxially deposited, an n-type AlGaN cladding layer 104 of approximately 0.5 $\mu$m is formed. The aluminum mole fraction of this lower cladding layer 104 generally ranges from 5 to 15 percent. Its silicon doping level is approximately 1 to $5\times10^{18}$ cm$^{-3}$.

Above the n-type AlGaN cladding layer 104, an InGaN multiple quantum well ("MQW") active layer 106, which is sandwiched between two GaN layers 105, is grown. This active layer 106 typically comprises 1 to 30 quantum wells, each of which is approximately 20 to 40 Angstroms in thickness. The active layer 106 can also be a single quantum well or a double heterostructure. The indium mole fraction of the InGaN active layer 106 ranges from 10 to 40 percent, which produces a laser at approximately 380 to 450 nanometers.

Figure 2:
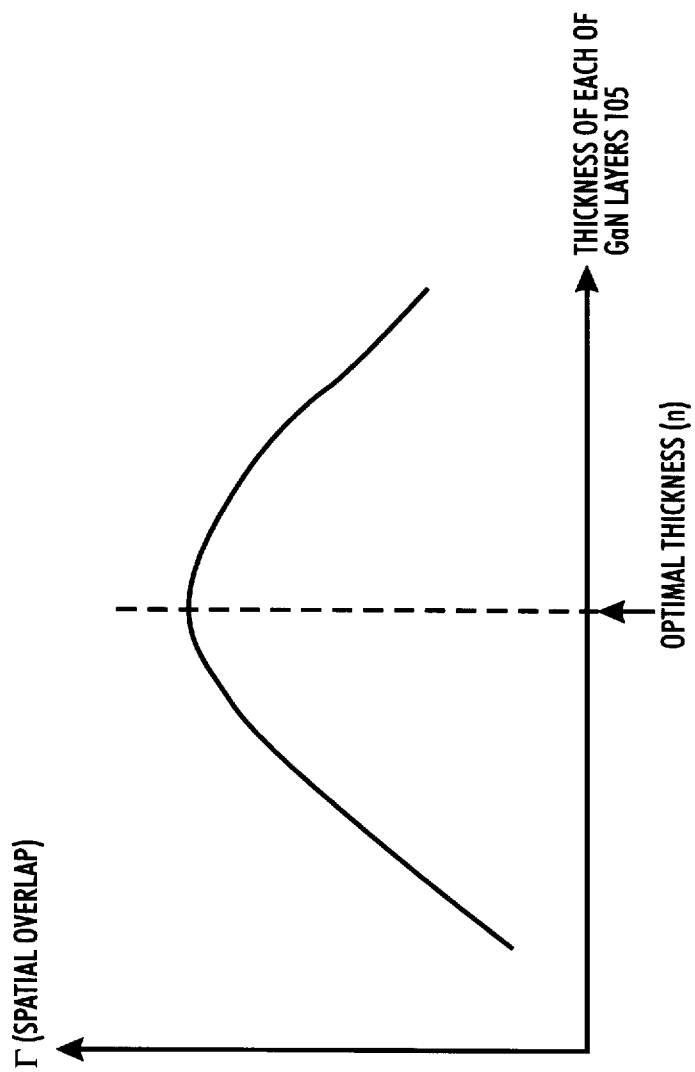
FIG. 2 illustrates the relationship between spatial overlap of optical mode with the active layer versus the thickness of each of the GaN layers which sandwich the active layer.

The GaN layers 105 are inserted to maximize the gain of the laser structure. The gain of the laser structure shown in FIG. 1 is proportional to the spatial overlap ($\Gamma$) of the optical mode with the active layer 106 of lasing element 116. The thickness of the GaN layers 105 which sandwich the active layer 106 is optimized to maximize the spatial overlap ($\Gamma$) of the optical mode. FIG. 2 illustrates the relationship between the spatial overlap ($\Gamma$) and the thickness of each of the GaN layers 105. A typical optimal thickness (n) for each of the GaN layers 105 ranges from 500 to 2000 Angstroms.

The GaN layer 105 below the active layer 106 shown in FIG. 1 is typically doped with silicon in the mid-$10^{18}$ cm$^{-3}$ range while the GaN layer 105 above the active layer 106 is doped with magnesium in the $10^{19}$ cm$^{-3}$ range. Such a level of magnesium doping generally results in a room temperature carrier concentration of about $10^{17}$ to $10^{18}$ cm$^{-3}$. The activation energy of magnesium is approximately 170 meV.

After both GaN layers 105 shown in FIG. 1 have been formed, a p-type AlGaN cladding layer 108 and a p-type GaN cap layer 110 are epitaxially deposited. The p-type AlGaN cladding layer 108 is approximately 0.5 $\mu$m in thickness with a doping level of $10^{19}$ to $10^{20}$ cm$^{-3}$. The p-type GaN cap layer 110 is approximately 1000 to 5000 Angstroms and is generally doped as heavily as possible to facilitate the formation of a low resistance p-type ohmic contact 122. A typical doping level is $10^{20}$ cm$^{-3}$, which is close to the solid solubility of magnesium in GaN. InGaN, which has a lower bandgap, may also be used to form the p-type cap layer 110.

Figure 3:
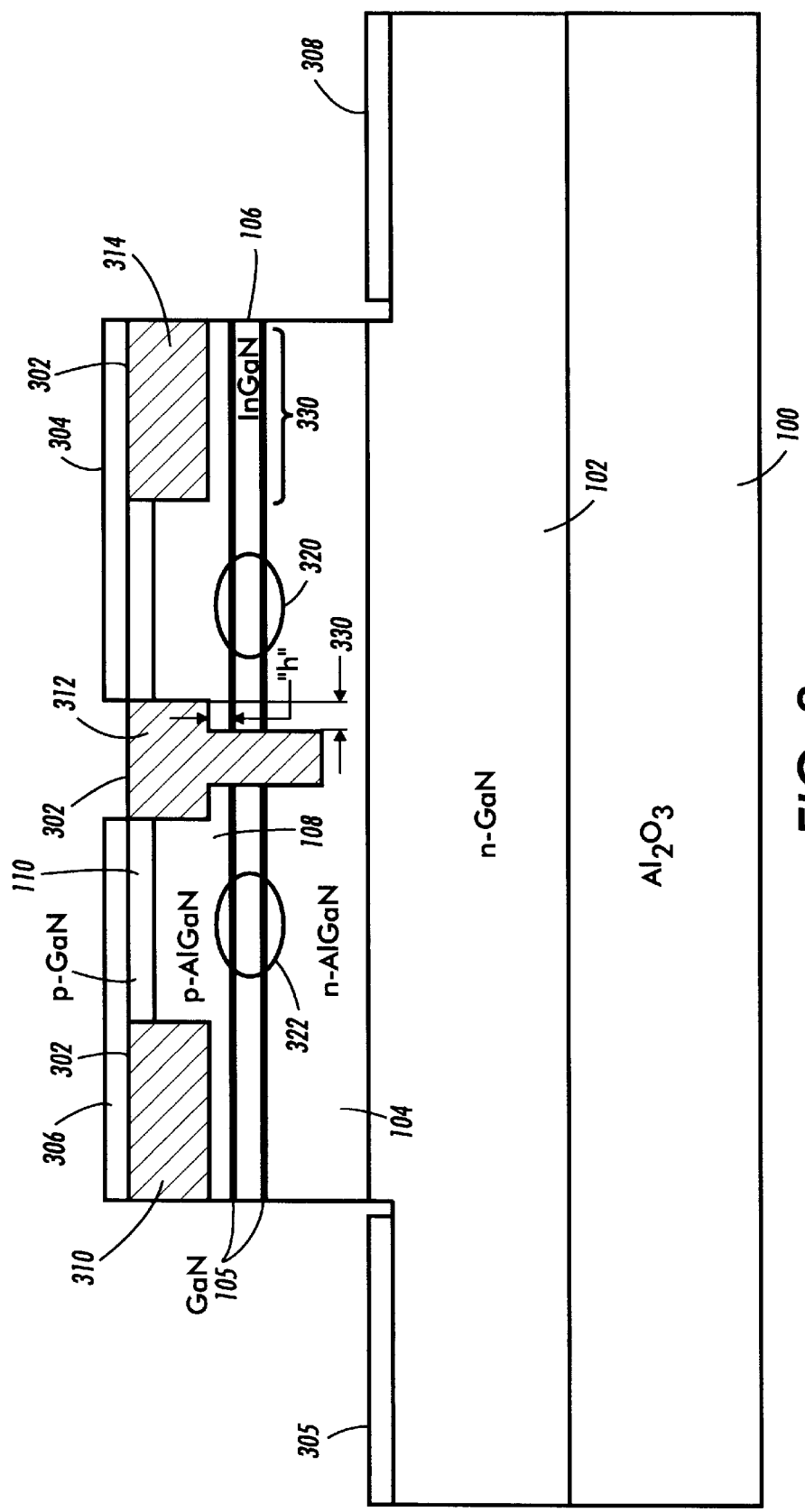
FIG. 3 illustrates a cross-sectional view of a dual-beam laser array which uses a high-index material deposited over a channel or groove waveguide to achieve lateral waveguiding.

FIG. 3 illustrates the formation of a dual-beam laser structure which uses a high-index non-crystalline material such as polycrystalline silicon to form the lateral waveguides 302. Again, nothing in this invention prevents the use of crystalline regrown GaN or InGaN as the high-index material for the lateral waveguides. As shown in FIG. 3, biasing to lasing element 320 is supplied through contacts 304 and 308 while biasing to lasing element 322 is supplied through contacts 305 and 306. In this embodiment, the shaded regions, 310, 312, and 314 represent the polysilicon materials which, in part, form the lateral waveguides 302 of lasing elements 320 and 322. These polysilicon materials 310, 312, and 314 are deposited on the groove structure shown in FIG. 3 by chemical vapor deposition ("CVD") at temperatures as low as 200° C. As stated previously, other materials such as amorphous silicon, polysilicon diamond, or a high-index spin-on materials can also be used.

The refractive index of polysilicon is approximately 4.7 at 450 nanometers, which is higher than the 2.5 refractive index of the InGaN MQW active layer 106. The high refractive index of the polysilicon materials, 310, 312 and 314, which are placed in proximity to the InGaN MQW active layer 106 in the vertical direction, couples light out of the lateral waveguiding regions 330. This outcoupling of light contributes to a reduction in the effective refractive index and represents a loss which stabilizes the optical mode in the lateral direction. Hence, such loss-guided laser structures only lase in the fundamental mode of the lasing elements 320 and 322 as shown in FIG. 3. The operation of a typical loss-guided laser structure is described in "Transverse Mode Stabilized Al$_x$Ga$_{1-x}$As Injection Lasers with Channeled-Substrate-Planar Structure," by Aiki et al., IEEE Journal of Quantum Electronics, Vol. QE-14, No. 2, pp.89–94, February 1978 and "Lateral Mode Discrimination in AlGaInP Selectively Buried Ridge Waveguide Lasers," by Bour, IEE Proceedings, Vol. 139, No. 1, pp.71–74, February 1992.

Figure 4:
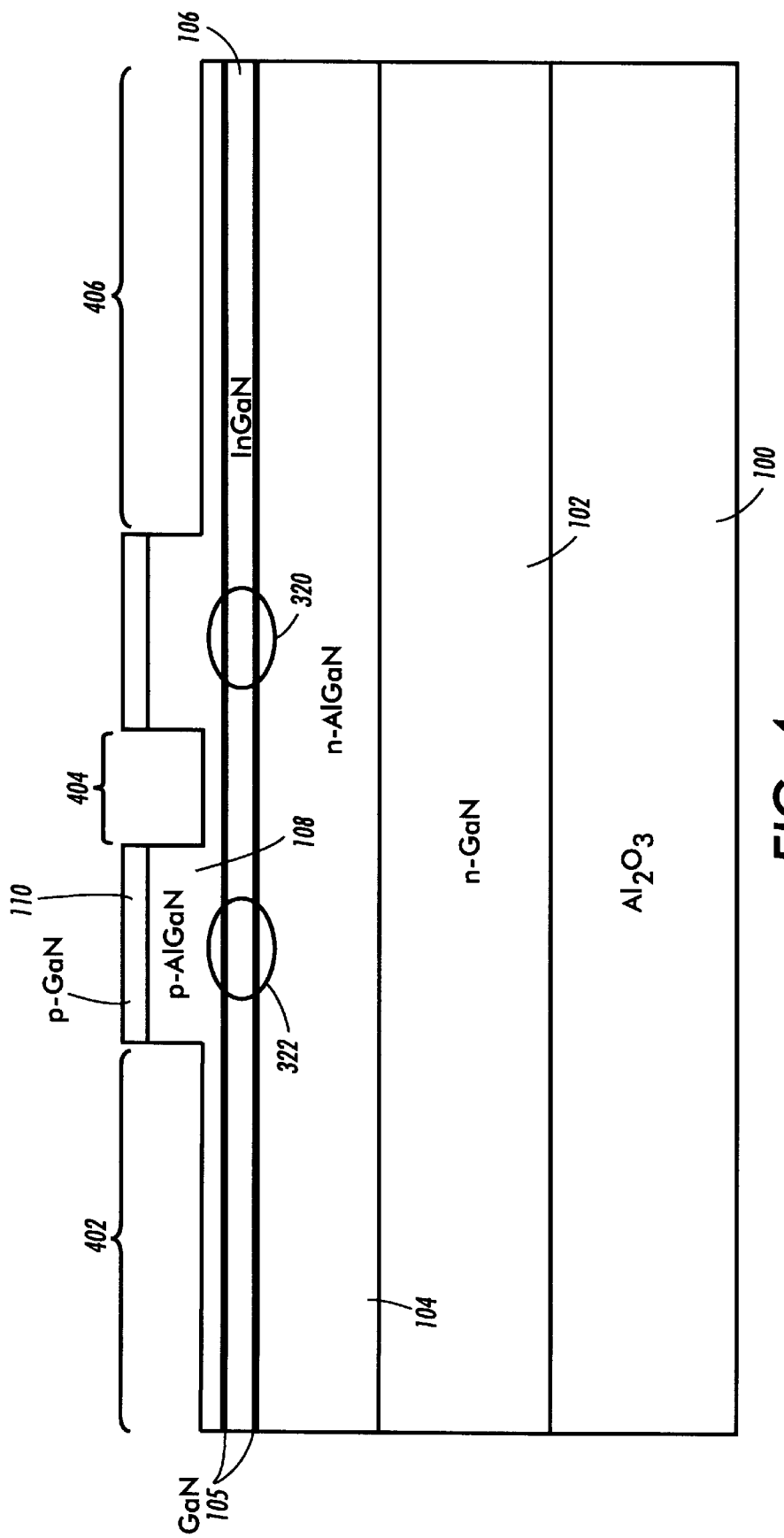
FIG. 4 illustrates the cross-sectional view of a dual-beam laser structure which has undergone an etching process for defining the regions in which lateral waveguides will be formed.

FIG. 4 illustrates the cross-sectional view of a dual-bean laser structure which has undergone an etching process to define the lateral waveguiding and isolation regions, 402, 404 and 406. After all the epitaxial layers shown in FIG. 3 have been formed, a mask is used to protect the regions in which lasing elements 320 and 322 are to be formed. Grooves 402, 404, and 406 are etched in the top p-type GaN and p-type AlGaN layers to form the lateral waveguiding regions by chemically assisted ion beam etching. Reactive ion etching, ion milling, or other known etching techniques can also be used. This etching process removes approximately 1 $\mu$m of epitaxial material and stops above the InGaN MQW active layer 106. The distance between the polysilicon and the top GaN layer 105 is indicated by "h" in FIG. 3. Typically, 1000 to 3000 Angstroms of p-type AlGaN material 108 remains above the top GaN layer 105.

Figure 5:
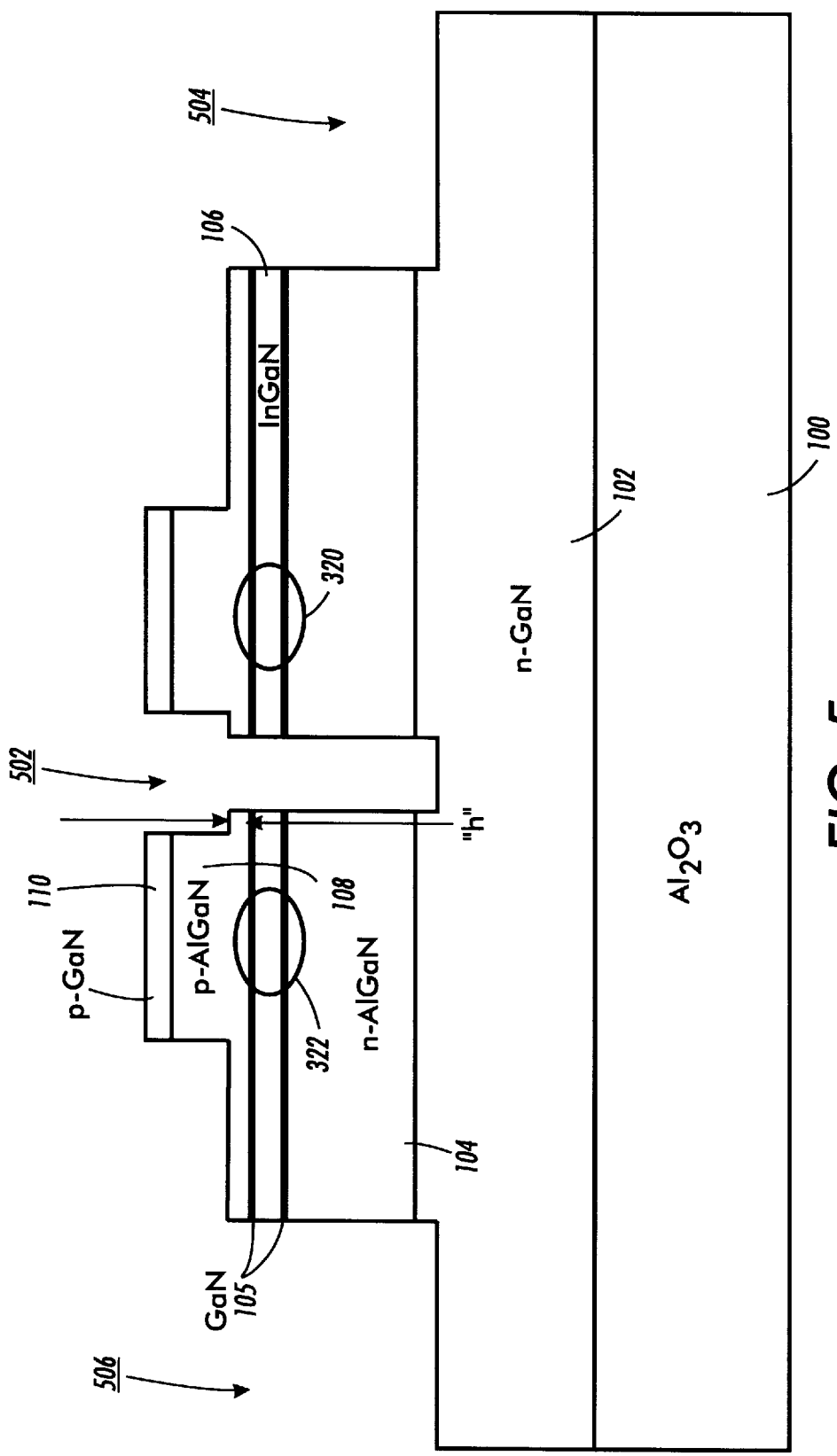
FIG. 5 illustrates the cross-sectional view of a dual-beam laser structure with deep channels or grooves for isolation and the formation of n-type contacts.

After the etching step as shown in FIG. 4 has been performed, a second etch is performed to form deeper channels or grooves for isolation and contact formation. As shown in FIG. 5, the second etching step produces deeper grooves 502, 504, and 506 to form the isolation regions. Since the groove 502 produced by the second etch is deeper and narrower than the original groove 404, the distance "h" between the high-index material to be deposited and the top GaN layer 105 will remain small. The deep grooves 502, 504, and 506 are formed by chemically assisted ion etching. The groove 502 between lasing elements 320 and 322 also provides isolation. This isolation groove 502 may be even deeper so that it reaches the substrate 100. In this embodiment, the grooves 504 and 506 reach the n-type GaN layer 102, on which n-type ohmic contacts will be formed. After the grooves 502, 504, and 506 have been formed, polysilicon is deposited on the sample by chemical vapor deposition. However, if the high-index material is conducting, the deep grooves for isolation should be formed after the deposition of the high-index material.

Figure 6:
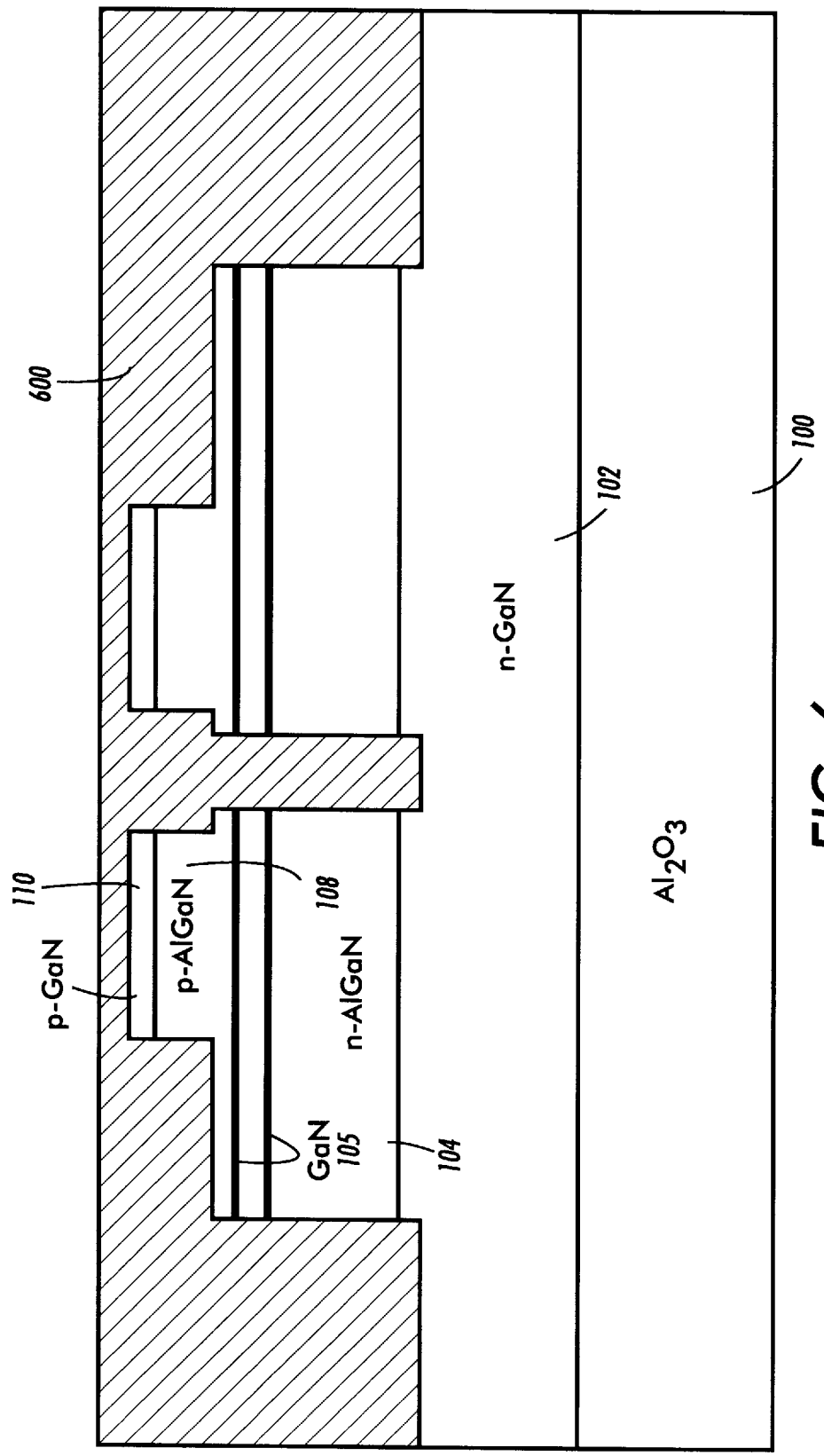
FIG. 6 illustrates the cross-sectional view of a dual-beam laser structure after polysilicon has been deposited on the surface.

The shaded region 600 in FIG. 6 represents the high-index polysilicon material. After the polysilicon layer 600 has been deposited on the sample, polysilicon in certain areas is selectively removed by etching so that p- and n-type contacts as shown in FIG. 3 can be formed. P-type contacts 304 and 306 are formed to contact the top GaN cap layer 110 whereas n-type contact 308 is formed to contact the n-type GaN buffer layer 102 as shown in FIG. 3.

The composition, dopants, doping levels and dimensions given above are exemplary only and variations in these parameters are permissible. Additionally, other layers in addition to the ones shown in the figures may also be included. Lastly, instead of Group III nitrides, other light emitting semiconductor materials may also be used. While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A semiconductor laser device having a lasing region and comprising:
   a substrate; and
   a plurality of contiguous semiconductor layers formed on said substrate including;
   a Group III-V nitride material active layer having a first refractive index;
   a pair of semiconductor cladding layers sandwiching said active layer to provide optical and carrier confinement in a direction which is perpendicular to the surface of said substrate; and
   a lateral waveguiding layer formed of a non-crystalline material having a second refractive index which is higher than said first refractive index, said lateral waveguiding layer being located laterally outboard of said lasing region and being in close proximity to said active layer for achieving an outcoupling of light which stabilizes said lasing region a direction which is parallel to the surface of said substrate.

2. The semiconductor laser device of claim 1 wherein said material having a second refractive index is deposited on a groove structure in one of said semiconductor cladding layers.

3. The semiconductor laser device of claim 1 wherein said material having a second refractive index is capable of being deposited at low temperatures.

4. The semiconductor laser device of claim 1 wherein said material of a second refractive index is a non-crystalline material.

5. The semiconductor laser device of claim 4 wherein said non-crystalline material is a spin-on material.

6. The semiconductor laser device of claim 4 wherein said non-crystalline material is polysilicon.

7. The semiconductor laser device of claim 4 wherein said non-crystalline material is amorphous silicon.

8. The semiconductor laser device of claim 1 wherein said substrate is $Al_2O_3$.

9. The semiconductor laser device of claim 1 wherein said laser device is an element in an array of semiconductor lasers.

10. The semiconductor laser device of claim 3 wherein said material having a second refractive index is capable of being deposited at temperatures as low as 200° C.

11. An array of semiconductor laser devices supported on a common substrate, wherein each device has a lasing region and comprises a plurality of contiguous semiconductor layers formed on said substrate including;
   a Group III-V nitride material active layer having a first refractive index;
   a pair of semiconductor cladding layers sandwiching said active layer to provide optical and carrier confinement in a direction which is perpendicular to the surface of said substrate; and
   a lateral waveguiding layer formed of a non-crystalline material having a second refractive index which is higher than said first refractive index, said lateral waveguiding layer being located laterally outboard of said lasing region and being in close proximity to said active layer for achieving an outcoupling of light which stabilizes said lasing region a direction which is parallel to the surface of said substrate.

* * * * *

UNITED STATES PATENT AND TRADEMARK OFFICE
CERTIFICATE OF CORRECTION

PATENT NO. : 5,812,576 Page 1 of 1
DATED : September 22, 1998
INVENTOR(S) : David P Bour It is certified that error appears in the above-identified patent and that said Letters Patent is hereby corrected as shown below:

<u>Column 1,</u>
Line 2, insert as a new paragraph:
-- This invention was made with Government support under Agreement No. 70NANB2H1241 awarded by the Department of Commerce. The Government has certain rights in this invention. --.

Signed and Sealed this

Thirteenth Day of June, 2006

JON W. DUDAS
*Director of the United States Patent and Trademark Office*